(12) United States Patent
Kondo

(10) Patent No.: US 10,645,851 B2
(45) Date of Patent: May 5, 2020

(54) TEMPLATE FOR ELECTRONIC COMPONENT CLAMPING DEVICE AND CONFIRMATION METHOD USING SAME

(71) Applicant: FUJI CORPORATION, Chiryu (JP)

(72) Inventor: Tatsue Kondo, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/330,515

(22) PCT Filed: Sep. 15, 2016

(86) PCT No.: PCT/JP2016/077229
§ 371 (c)(1),
(2) Date: Mar. 5, 2019

(87) PCT Pub. No.: WO2018/051451
PCT Pub. Date: Mar. 22, 2018

(65) Prior Publication Data
US 2019/0200498 A1   Jun. 27, 2019

(51) Int. Cl.
*H05K 13/08*   (2006.01)
*G01D 5/26*   (2006.01)
*H05K 13/04*   (2006.01)

(52) U.S. Cl.
CPC .......... *H05K 13/0812* (2018.08); *G01D 5/26* (2013.01); *H05K 13/0408* (2013.01); *H05K 13/085* (2018.08)

(58) Field of Classification Search
CPC .......... H05K 13/0408; H05K 13/0812; H05K 13/085; G01D 5/26
See application file for complete search history.

(56) References Cited

FOREIGN PATENT DOCUMENTS

JP         10-43965 A       2/1998
WO    WO-2016017029 A1 *  2/2016  ........... H05K 13/046

OTHER PUBLICATIONS

International Search Report dated Nov. 29, 2016 in PCT/JP2016/077229 filed on Sep. 15, 2016.

* cited by examiner

*Primary Examiner* — Peter B Kim
(74) *Attorney, Agent, or Firm* — Oblon, McClelland, Maier & Neustadt, L.L.P.

(57) ABSTRACT

Template is a plate-like template used for confirming whether a pair of claws will interfere with another component around mounting position when the pair of claws clamp electronic component and mounts an electronic component on board. In electronic component clamping device, distance between the pair of claws, when the pair of claws is in the opened position, can be selected from multiple distances in accordance with the size of electronic component. Template includes first region having width corresponding to a selected distance between the pair of claws when the pair of claws is in the opened position.

6 Claims, 7 Drawing Sheets

TEMPLATE FOR ELECTRONIC COMPONENT CLAMPING DEVICE AND CONFIRMATION METHOD USING SAME

TECHNICAL FIELD

The techniques disclosed in the present specification relate to a template for an electronic component clamping device and a confirmation method using the same.

BACKGROUND ART

For example, a mounting machine for mounting an electronic component on a board includes an electronic component clamping device for clamping an electronic component. Generally, the electronic component clamping device includes a pair of claws arranged facing each other, and an opening/closing mechanism for opening and closing the pair of claws. The pair of claws contact a pair of side faces of an electronic component to clamp the electronic component. The opening/closing mechanism moves the pair of claws to a first position to clamp the electronic component and a second position to release the electronic component. When the electronic component is mounted on a board, the electronic component clamping device is moved with respect to the electronic component in a state in which the pair of claws is fixed at the second position. Thereafter, the pair of claws is moved to the first position, and the pair of claws clamps the electronic component. By moving the electronic component clamping device with the electronic component clamped, the electronic component is moved to a mounting position of the board. When the electronic component has been moved to the mounting position, the pair of claws is moved to the second position and the electronic component is released. Thus, the electronic component is mounted on the board.

Multiple types of electronic components are clamped with this type of electronic component clamping device. Sizes of electronic components may vary by having electronic components of different types. In order to clamp electronic components of different sizes with the same electronic component clamping device, the distance between the pair of claws may be varied. Then, the electronic component is clamped between the pair of claws whose distance is changed. This makes it possible to clamp multiple types of electronic components with one electronic component clamping device. As a technique for mounting components of different sizes using the same device, for example, there is a seal ring assembling device disclosed in Patent Literature 1.

PATENT LITERATURE

Patent Literature 1: JP-A-10-43965

BRIEF SUMMARY

Technical Problem

When mounting an electronic component on a board using the electronic component clamping device described above, another component may already be mounted around the mounting position of the electronic component. When mounting of an electronic component on such a board is attempted, the pair of claws clamping the electronic component may interfere with another component already mounted. That is, the pair of claws may come into contact with another component. In particular, when the pair of claws is moved to the second position to release the electronic component, the distance between the pair of claws is wider than when the pair of claws is in the first position for clamping the electronic component, making it more likely for the pair of claws to interfere with another component. Therefore, whether the pair of claws interferes with another component may be confirmed in advance before mounting the electronic component on the board. In this case, conventionally, an actual pair of claws is used to confirm whether the pair of claws interferes with another component. Alternatively, a CAD drawing is used to confirm whether the pair of claws interferes with another component. However, in the conventional method, it is necessary to prepare an actual pair of claws or a CAD drawing each time the confirmation of interference is performed, thus requiring labor. Accordingly, the present description provides a technique capable of easily confirming whether a pair of claws interferes with another component around the mounting position of an electronic component.

Solution to Problem

The present description discloses a plate-like template used in an electronic component clamping device. The electronic component clamping device includes a pair of claws configured to contact a pair of side faces of an electronic component to be mounted on a board and clamp the electronic component, and a moving mechanism configured to move the pair of claws to a first position for clamping the electronic component and a second position for releasing the electronic component. The plate-like template is used for confirming whether the pair of claws interferes with another component around a mounting position when the pair of claws clamps an electronic component and mounts the electronic component on the board. In the electronic component clamping device, the distance between the pair of claws when the pair of claws is in the second position can be selected from multiple distances in accordance with the size of the electronic component. There are multiple templates corresponding to the multiple distances between the pair of claws. A template corresponding to a selected distance among the multiple distances between the pair of claws includes a first region which has a width corresponding to the selected distance between the pair of claws when the pair of claws is in the second position.

In the above-described configuration, first, a user of the electronic component clamping device selects, according to the size of an electronic component, the distance between the claws when the pair of claws is in the second position. For example, when an electronic component having a large size is clamped, the distance between the pair of claws is increased. On the other hand, when an electronic component having a small size is clamped, the distance between the pair of claws is reduced. Subsequently, a template corresponding to the selected distance between the pair of claws is prepared. Then, the prepared template is superimposed on a board on which the electronic component is to be mounted. On this board, another component has already been mounted around the mounting position of the electronic component. For example, another component that is to be electrically connected to the electronic component may already be mounted on the board. Therefore, when the electronic component is mounted on the board, the pair of claws may interfere with another component already mounted on the board. That is, the pair of claws may come into contact with another component. Therefore, whether the pair of claws interferes with another component is confirmed in advance before mounting the electronic component on the board. Specifically, whether the first region of the template superimposed on the board interferes with another component is confirmed. The first region of the template has a width corresponding to the distance between the pair of claws when the pair of claws is in the second position. Therefore, when the first region of the template superimposed on the board interferes with another component, it can be determined that the pair of claws interferes with another component when the pair of claws is in the second position. On the other hand, when the first region does not interfere with another component, it can be determined that the pair of claws does not interfere with another component. Therefore, it is possible to easily confirm whether the pair of claws interferes with another component around the mounting position of an electronic component by simply superimposing the template on the board.

The present description discloses a confirmation method using a template for an electronic component clamping device. The electronic component clamping device includes a pair of claws configured to contact a pair of side faces of an electronic component to be mounted on a board and clamp the electronic component, and a moving mechanism configured to move the pair of claws to a first position for clamping the electronic component and a second position for releasing the electronic component. In the electronic component clamping device, it is confirmed whether the pair of claws interferes with another component around a mounting position when the pair of claws clamps the electronic component and mounts the electronic component on a board. In the electronic component clamping device, the distance between the pair of claws when the pair of claws is in the second position can be selected from multiple distances in accordance with the size of the electronic component. There are multiple templates corresponding to the multiple distances between the pair of claws. A template corresponding to a selected distance among the multiple distances between the pair of claws includes a first region which has a width corresponding to the selected distance between the pair of claws when the pair of claws is in the second position. The confirmation method includes a step of superimposing the template, corresponding to the selected distance, and the board on which an electronic component is to be mounted and a step of confirming whether the pair of claws interferes with another component around the mounting position based on the first region of the template.

According to such a configuration, similarly to above, it is possible to easily confirm whether the pair of claws interferes with another component around the mounting position of an electronic component.

DESCRIPTION OF EMBODIMENTS

Figure 1:
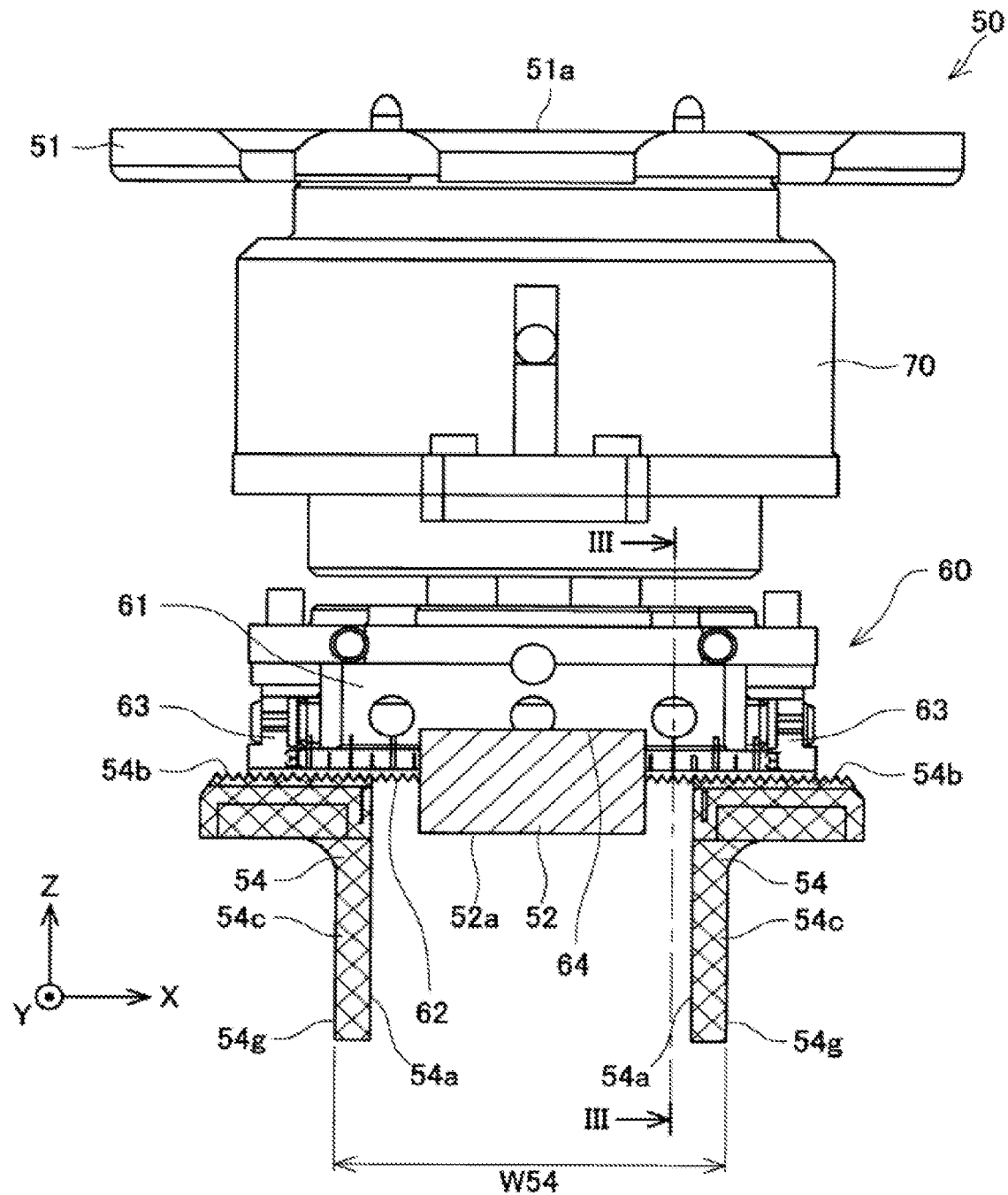
FIG. 1 is a front view of an electronic component clamping device.

The main features of embodiments to be described hereinafter are listed below. Technical elements described below are mutually-independent technical elements which exhibit technical usefulness by themselves or by various combinations, and are not limited to the combinations described in the claims as filed.

(Feature 1) An electronic component clamping device may include an adjacent portion located above a pair of claws in a range adjacent to the pair of claws. A template corresponding to a selected distance may include a second region located at a position corresponding to the adjacent portion in a range adjacent to a first region.

The electronic component clamping device includes the adjacent portion in a range adjacent to the pair of claws. The adjacent portion is configured with, for example, a part of a moving mechanism for moving the pair of claws. The adjacent portion is located above the pair of claws so as not to interfere with the clamps when the pair of claws clamps an electronic component. That is, the adjacent portion is located at a position higher than the height of the pair of claws. The electronic component clamping device clamps an electronic component with the pair of claws and mounts the electronic component on a board. At this time, if the electronic component clamping device has the adjacent portion, the adjacent portion may interfere with another component which exists in a range adjacent to the mounting position of the electronic component. Since the adjacent portion is located above the pair of claws, if a component higher than the electronic component exists in a range adjacent to the mounting position of the electronic component, the adjacent portion may interfere with the component. Thus, the above template is configured to include the second region located at a position corresponding to the adjacent portion in a range adjacent to the first region. According to such a configuration, in a case where there is another component that interferes with the second region of the template when the template is superimposed on the board, whether the adjacent portion of the electronic component clamping device will interfere with another component can be determined. If the height of the component interfering with the second region of the template is high, it becomes more likely that the adjacent portion will interfere with the component. On the other hand, when there is no other component that interferes with the second region of the template, it is determined that there is no possibility that the adjacent portion will interfere with another component. In this manner, whether the second region of the template will interfere with another component in a range adjacent to the mounting position of the electronic component can be easily confirmed by simply superimposing the template on the board. Further, confirmation of interference with the first region and confirmation of interference with the second region of the template can be performed simultaneously.

(Feature 2) The first region and the second region may be indicated in color. The lightness of the color of the first region and the lightness of the color of the second region may be different.

With such a configuration, the first region and the second region of the template can be clearly distinguished. Therefore, the interference confirmation with the first region and the interference confirmation with the second region can be performed precisely. That is, whether the pair of claws interferes with another component can be precisely confirmed, and whether the adjacent portion in the range adjacent to the pair of claws will interfere with another component can also be precisely confirmed.

(Feature 3) The electronic component clamping device may include a peripheral portion located above the adjacent portion in a range surrounding the pair of claws and the adjacent portion. The template corresponding to the selected distance may include a third region located at a position corresponding to the peripheral portion around the first region and the second region.

With such a configuration, similarly to the case of the adjacent portion and the second region described above, whether the peripheral portion interferes with another component can be confirmed with the third region. Specifically, in a case where there is another component that interferes with the third region of the template when the template is superimposed on the board, whether the peripheral portion of the electronic component clamping device will interfere with another component can be determined. On the other hand, when there is no other component that interferes with the third region of the template, it can be determined that there is no possibility that the peripheral portion will interfere with another component. Since confirmation with the second region and confirmation with the third region of the template can be performed, multistage confirmation can be performed. Since the electronic component clamping device has multiple portions having different heights (i.e., the adjacent portion and the peripheral portion), it is particularly effective in confirming whether the interference with another component will occur at multiple stages according to height.

(Feature 4) The third region may be indicated in color. The lightness of the color of the first region, the lightness of the color of the second region, and the lightness of the color of the third region may be different from each other.

With such a configuration, the first region, the second region, and the third region of the template can be clearly distinguished. Therefore, confirmation with the first region, the second region, and the third region can be performed precisely.

First Embodiment

Figure 2:
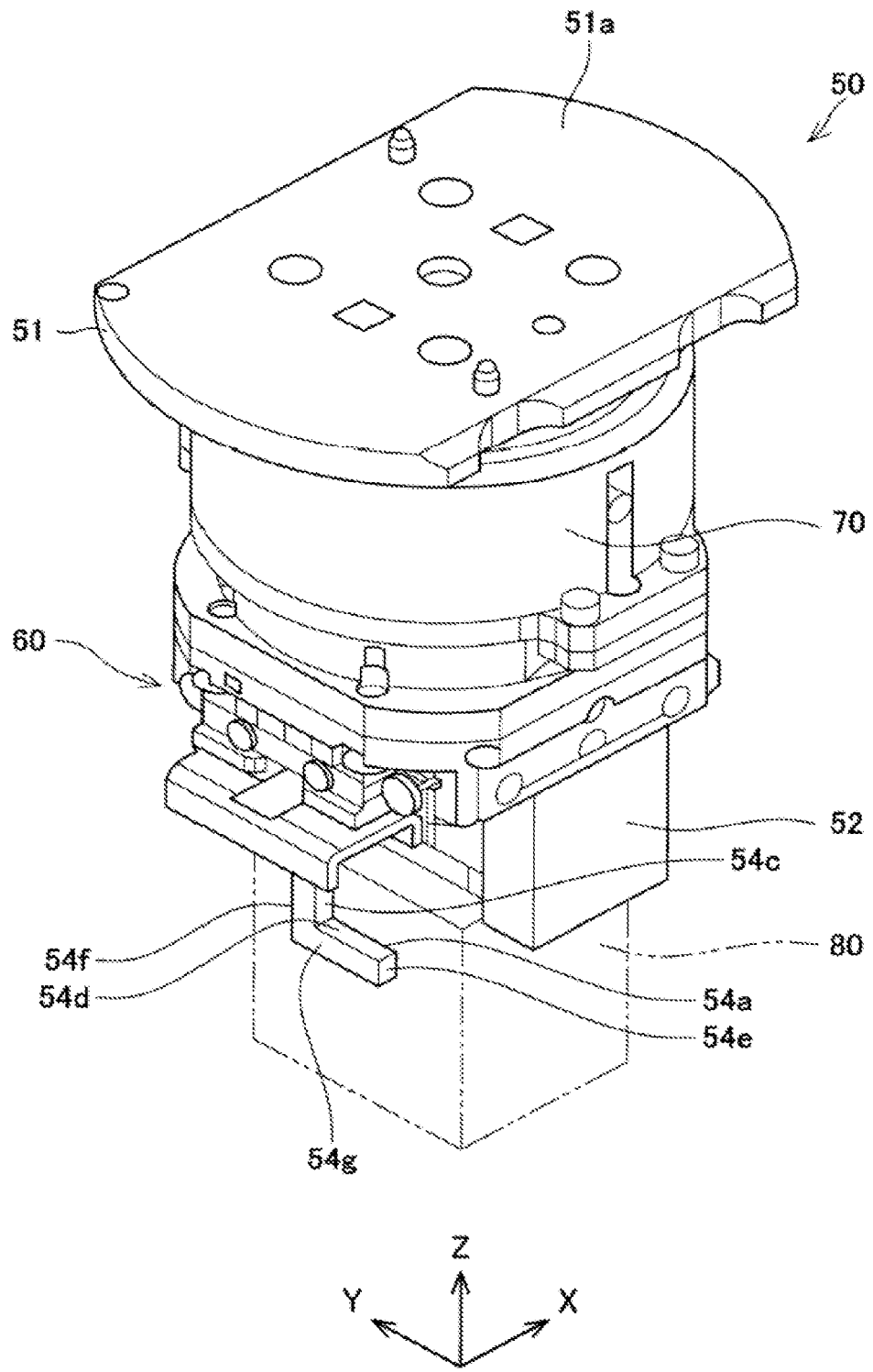
FIG. 2 is a perspective view of the electronic component clamping device.

Template 10 of the embodiment will be described with reference to the drawings. First, electronic component clamping device 50 in which template 10 is used will be described in detail. Electronic component clamping device 50 is installed in a component mounting machine for mounting an electronic component on a board. Electronic component clamping device 50 clamps an electronic component supplied from a component supply section of the component mounting machine, moves the electronic component to a predetermined position (i.e., the mounting position) of a board in a state of clamping the electronic component, and releases the clamped electronic component at the predetermined position (i.e., the mounting position) of the board. As a result, the electronic component supplied from the component supply section is mounted on the board. As shown in FIGS. 1 and 2, electronic component clamping device 50 includes a mechanical chuck main body 70, fitting member 52 that abuts on the upper face of electronic component 80 when electronic component 80 is clamped, a pair of claws 54 whose clamping faces 54a contact the pair of side faces of electronic component 80 and clamp the electronic component, and opening/closing mechanism 60 (an example of the moving mechanism) that opens and closes the pair of claws 54.

Attachment section 51 is provided at the upper end of mechanical chuck main body 70. Upper face 51a of attachment section 51 is configured to be attached to the head (not shown) of the component mounting machine. When the head moves in an XYZ direction, mechanical chuck main body 70 can also move in the XYZ direction. Opening/closing mechanism 60 is attached to the lower end of mechanical chuck main body 70. Mechanical chuck main body 70 accommodates a control circuit and the like for controlling the opening and closing of opening/closing mechanism 60 in response to a command from the head.

Opening/closing mechanism 60 includes main body 61 attached to mechanical chuck main body 70, and a pair of arms 63 attached to main body 61 so as to be movable in the X-direction. Attachment face 64 is formed on the lower face of main body 61. Attachment face 64 is provided substantially at the center in the X-direction of main body 61. Multiple types of fitting members 52 may be detachably attached to attachment face 64. Thus, an appropriate type of fitting member 52 is selected from multiple types of fitting members 52 in accordance with the shape of electronic component 80. Arms 63 are provided on each side face (yz face in the figure) of main body 61. Arms 63 and 63 each can be moved with an actuator (not-shown) to a position close to main body 61 (i.e., a closed position [an example of a first position]) and a position separated from main body 61 (i.e., man opened position [an example of a second position]). The actuator is controlled with the control circuit of mechanical chuck main body 70. Arms 63 and 63 are interlocked so that when one moves to the closed position, the other also moves to the closed position, and when one moves to the opened position, the other also moves to the opened position. On lower face 62 of each arm 63, multiple grooves extending in the Y-direction (perpendicular to the drawing sheet) are formed. Multiple types of claws 54 may be detachably attached to lower faces 62 of arms 63. As will be described later, grooves that engage with grooves formed in lower faces 62 of arms 63 are formed in the upper faces of claws 54. In this embodiment, by forming multiple grooves in lower faces 62 of arms 63, the attachment position of claws 54 to arms 63 can be adjusted in the X-direction.

Fitting member 52 is a block-shaped member, the upper face of which is attached to attachment face 64 of opening/closing mechanism 60, and lower face 52a of which abuts on the upper face of electronic component 80. When the upper face of electronic component 80 abuts on lower face 52a of fitting member 52, electronic component 80 is clamped in the correct posture with respect to electronic component clamping device 50. That is, as shown in FIG. 2, at the time of clamping electronic component 80 with electronic component clamping device 50, the orientation of electronic component 80 is stabilized by bringing lower face 52a of fitting member 52 into contact with the upper face of electronic component 80. Therefore, electronic component 80 can be clamped without shifting.

Figure 3:
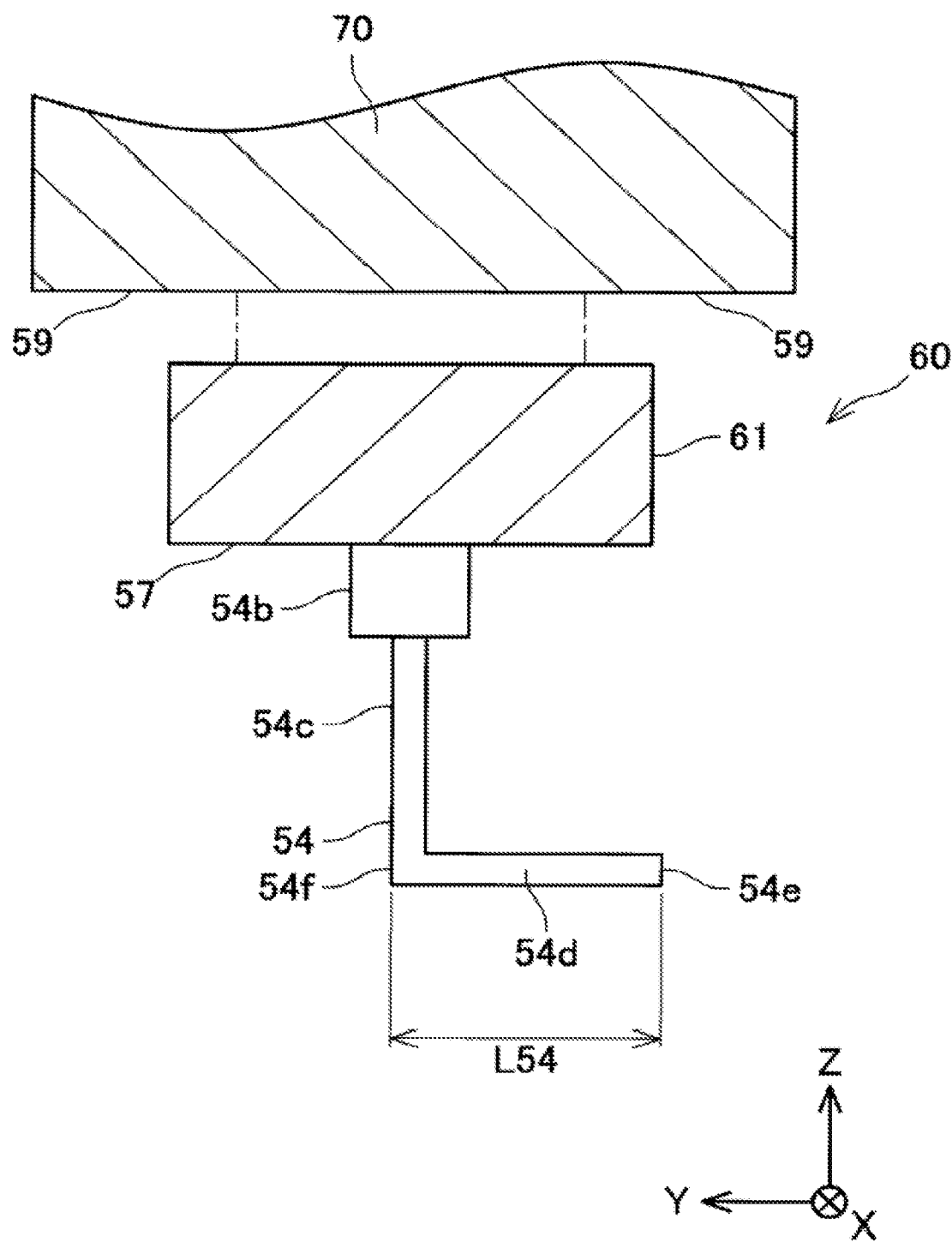
FIG. 3 is a sectional view (sectional view along III-III in FIG. 1) of a portion of the electronic component clamping device.

As shown in FIG. 3, a step is formed between mechanical chuck main body 70 and main body 61 of opening/closing mechanism 60 attached to mechanical chuck main body 70. Adjacent portion 57 is formed on the lower face of main body 61 of opening/closing mechanism 60. Adjacent portion 57 is formed with the lower face of main body 61 which protrudes from the pair of claws 54 in the Y-direction. Adjacent portion 57 is formed in a range adjacent to the pair of claws 54. Adjacent portion 57 is located above the pair of claws 54. Peripheral portion 59 is formed on the lower face of mechanical chuck main body 70. Peripheral portion 59 is formed around the pair of claws 54 and adjacent portion 57. Peripheral portion 59 is formed with the lower face of mechanical chuck main body 70 which protrudes beyond main body 61 of opening/closing mechanism 60 in the Y-direction. Peripheral portion 59 is located above adjacent portion 57.

As shown in FIGS. 1 to 3, each claw 54 has plate-shaped upper end portion 54b, intermediate portion 54c extending downward from upper end portion 54b, and clamp section 54d extending laterally from intermediate portion 54c. The multiple grooves are formed in upper end portion 54b. The multiple grooves of upper end portion 54b are arranged side by side in the X-direction and extend in the Y-direction (i.e., perpendicular to the drawing sheet). The grooves formed in lower face 62 of arm 63 engage with the grooves of upper end portion 54b. Claw 54 is provided with intermediate portion 54c extending downward from one end of upper end portion 54b (i.e., the end on which fitting member 52 is disposed). Camp section 54d extends in the Y-direction from the lower end of intermediate portion 54c. Clamp section 54d of each claw 54 includes front end face 54e, rear end face 54f, and outer side face 54g. One face of clamp section 54d (i.e., the face on the side where fitting member 52 is disposed) is clamping face 54a for clamping electronic component 80. When the pair of claws 54 is attached to the pair of arms 63, clamping faces 54a of claws 54 are opposed to each other and fitting member 52 is disposed at an intermediate position therebetween. In the present embodiment, by forming the multiple grooves on both lower face 62 of arm 63 and upper end portion 54b of claw 54, claw 54 can handle electronic components 80 of various sizes. For example, when the size of electronic component 80 is large (size in the X-direction is large), the pair of claws 54 may be attached to claw attachment positions, each of which is largely separated from the intermediate position (i.e., a position which is further separated from fitting member 52 as electronic component 80 is larger). As a result, it is possible to clamp relatively large electronic components 80 to relatively small electronic components 80 with the same type of claws 54 while keeping the movable amount of arms 63 (movable amount of claw 54) the same. It should be noted that multiple types of claws 54 can be attached to and detached from lower face 62 of arms 63 for the case where only the change in the attachment position of claws 54 is insufficient.

When opening/closing mechanism 60 opens and closes the pair of claws 54, the pair of claws 54 can have a closed position for clamping electronic component 80 and an opened position for releasing electronic component 80. Depending on the attachment position of the pair of claws 54 to the pair of arms 63, distance W54 between side faces 54g of the pair of claws 54 when the pair of claws 54 is in the opened position is different. In electronic component clamping device 50, distance W54 between side faces 54g of the pair of claws 54 when the pair of claws 54 is in the opened position can be selected from multiple distances in accordance with the size of electronic component 80. Among the multiple distances between the pair of claws 54, an appropriate distance is selected in accordance with the size of electronic component 80.

When electronic component 80 is clamped with above-described electronic component clamping device 50, first, arms 63 and 63 of opening/closing mechanism 60 are driven and arms 63 and 63 each are moved to a position (opened position) which is farthest from main body 61. As a result, the pair of claws 54 is located at positions farthest from fitting member 52. Next, the head (not shown) is moved in the XYZ direction with respect to electronic component 80 to move electronic component clamping device 50 until fitting member 52 abuts on the upper face of electronic component 80. When fitting member 52 abuts on the upper face of electronic component 80, arms 63 and 63 are moved in a direction approaching main body 61. As a result, clamping faces 54a of the pair of claws 54 abut on the side faces of electronic component 80, and electronic component 80 is clamped with the pair of claws 54. That is, when arms 63 and 63 are moved toward the position closest to fitting member 52 (closed position), clamping faces 54a of claws 54 abut on the side faces of electronic component 80 during some point in the movement, and the movement of arms 63 and 63 and claws 54 and 54 stops. In this state, since arms 63 and 63 are attempting to move to the closed position, claws 54 and 54 press against side faces of electronic component 80, thereby clamping electronic component 80. Accordingly, the example of the first position is the position of claws 54 and 54 when arms 63 and 63 are moved to the closed position. As is apparent from the above description, when the width (i.e., the width in the X-direction) of electronic component 80 is larger than the distance between claws 54 and 54 when claws 54 and 54 are fixed at the first position, electronic component 80 can be clamped with claws 54 and 54. When electronic component 80 is clamped with electronic component clamping device 50, the head moves in the XYZ direction while electronic component 80 is clamped. As a result, electronic component 80 moves to the mounting position of the board. When electronic component 80 is moved to the mounting position, arms 63 and 63 of opening/closing mechanism 60 are driven to move the pair of claws 54 to the position farthest from fitting member 52, thereby releasing electronic component 80. Thus, electronic component 80 is mounted on the board.

Before electronic component 80 is mounted, another component may already be mounted on the board on which electronic component 80 is to be mounted. Another component may be mounted around the mounting position of electronic component 80. Then, when the pair of claws 54 clamps electronic component 80 and mounts the electronic component on the board, the pair of claws 54 may interfere with another component already mounted. That is, the pair of claws 54 may contact another component other than electronic component 80. In particular, when the pair of claws 54 is in the opened position for releasing electronic component 80, since the distance between the pair of claws 54 is greater than in the closed position, the pair of claws 54 is likely to interfere with another component already mounted on the board. Therefore, template 10 is used to confirm in advance whether the pair of claws 54 will interfere with another component.

Figure 4:
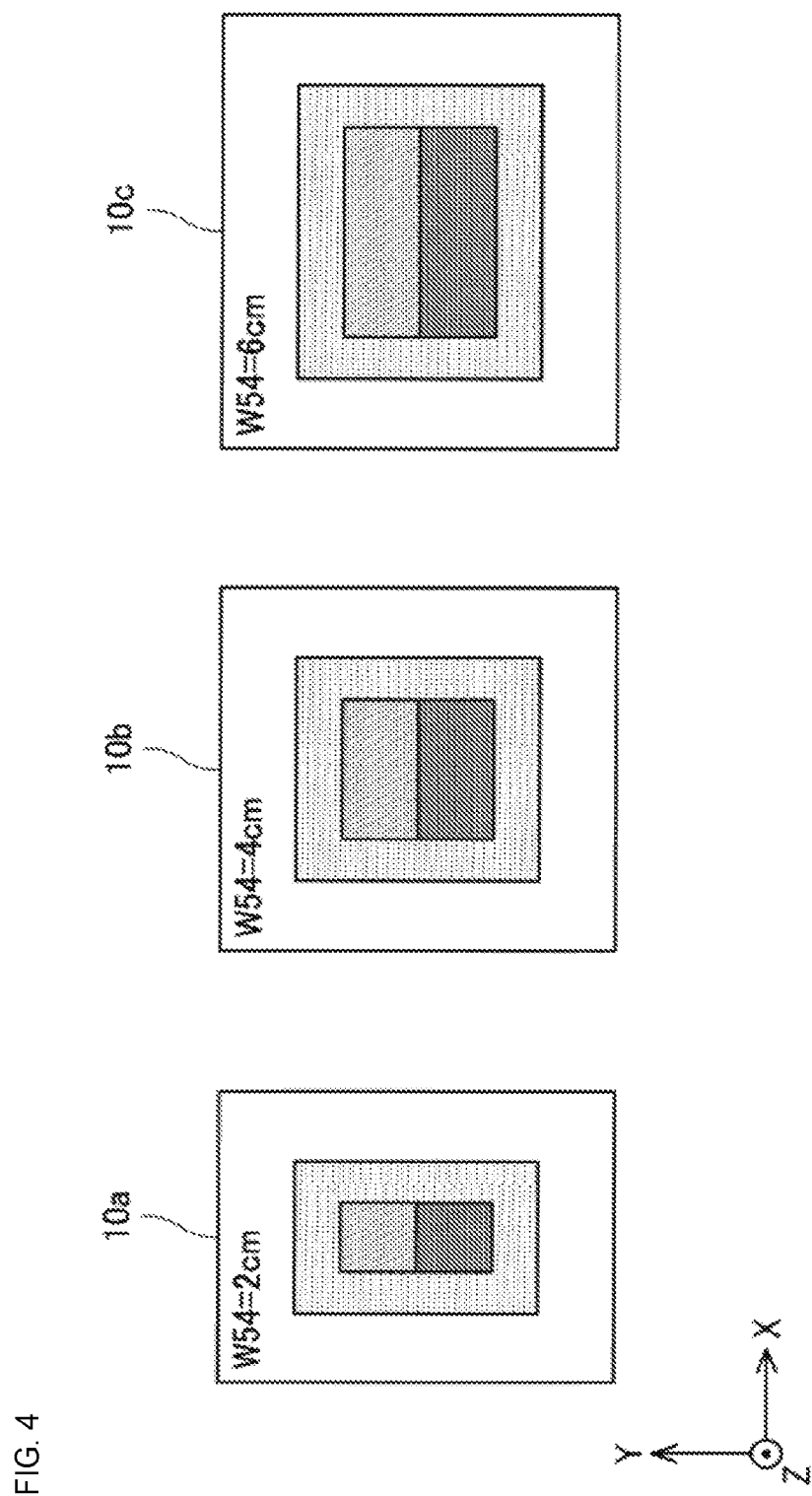
FIG. 4 is a plan view of multiple templates.

Next, the configuration of template 10 will be described. As shown in FIG. 4, multiple templates 10 (10a, 10b, 10c) are prepared for electronic component clamping device 50 described above. In electronic component clamping device 50 described above, depending on the attachment positions of the pair of claws 54 to the pair of arms 63, multiple distances are possible for distance W54 between the pair of claws 54 when the pair of claws 54 is in the opened position. Therefore, multiple templates 10 (10a, 10b, 10c) corresponding to the multiple distances between the pair of claws 54 are prepared. For example, when distance W54 between the pair of claws 54 is 2 cm, 4 cm, or 6 cm, template 10a for 2 cm, template 10b for 4 cm, and template 10c for 6 cm corresponding to these distances are prepared. Hereinafter, template 10a for 2 cm will be described as a typical example. The configuration for template 10b for 4 cm and template 10c for 6 cm is the same as that of template 10a for 2 cm except that distance W54 between the pair of claws 54 is different. Therefore, descriptions of template 10b for 4 cm and template 10c for 6 cm are omitted.

Figure 5:
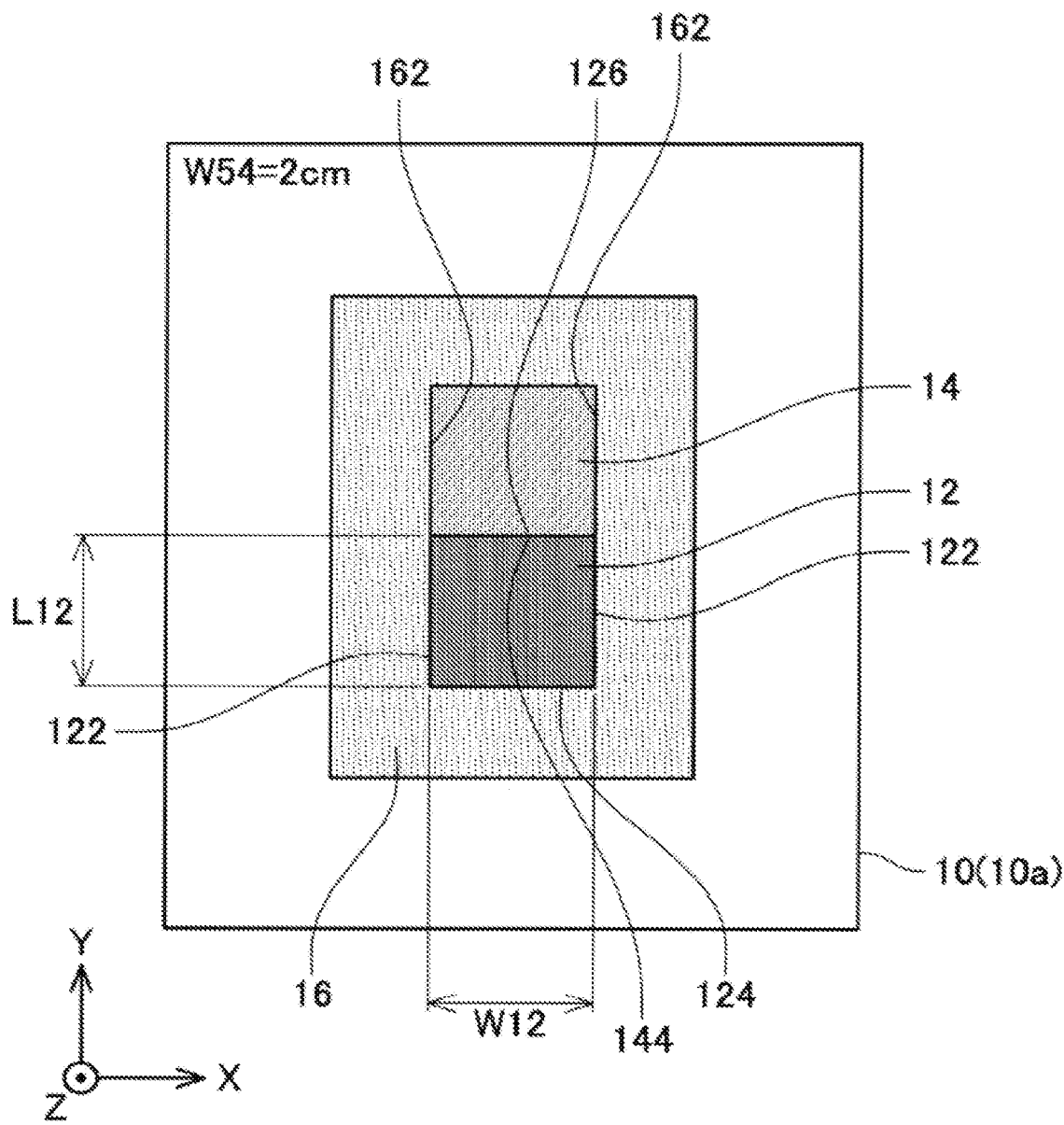
FIG. 5 is a plan view of a template.
Figure 6:
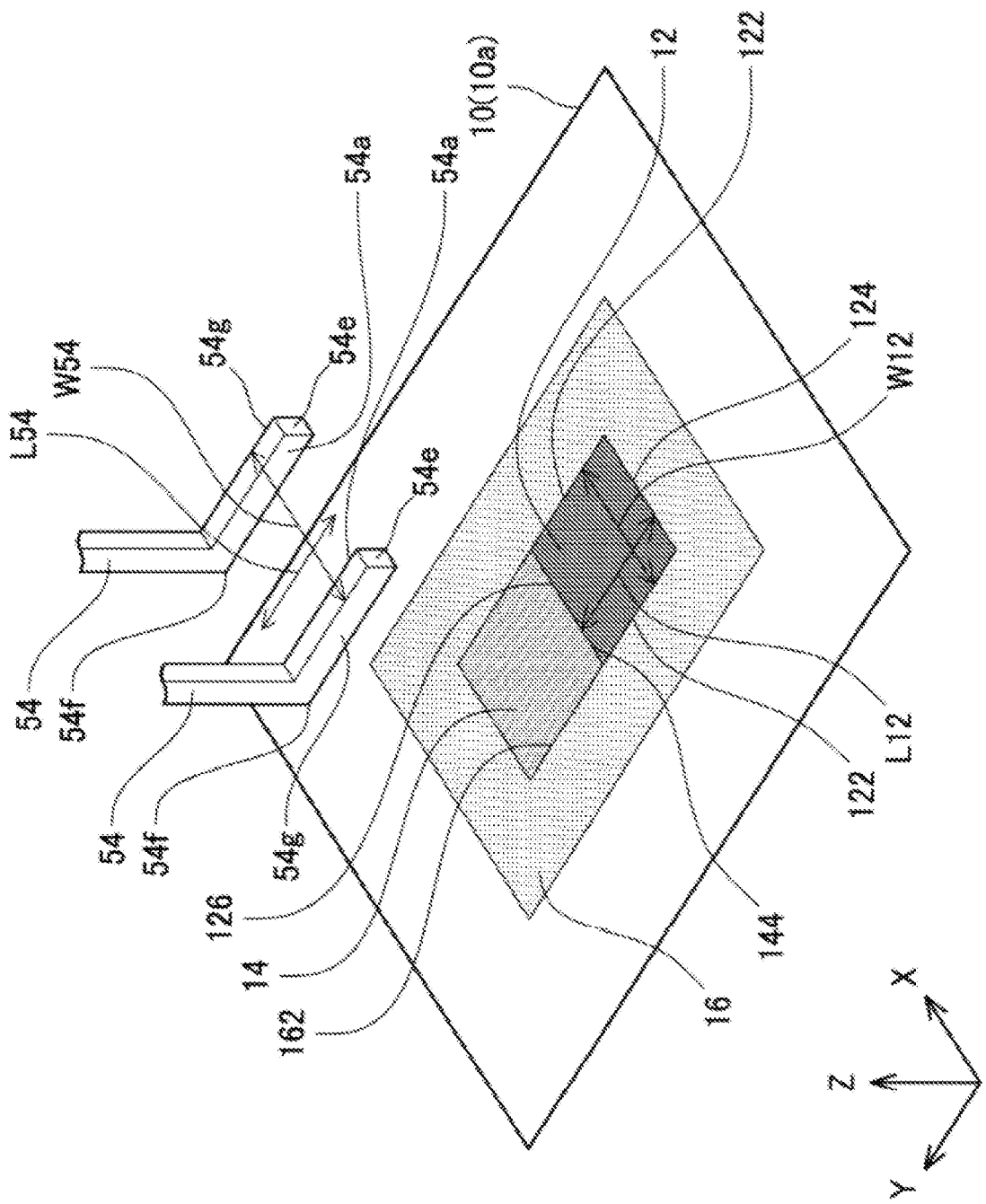
FIG. 6 is a perspective view of the template.

Plate-like template 10 (10a) is a two-dimensional planar plate member formed of a transparent material. As template 10a, for example, a transparent paper (OHP film or the like) can be used. As shown in FIGS. 5 and 6, template 10a includes first region 12, second region 14, and third region 16. First region 12, second region 14, and third region 16 are indicated on the face of the transparent two-dimensional planar plate member.

First region 12 is formed in a rectangular shape. First region 12 is indicated in color. For example, first region 12 is indicated in blue. First region 12 is transparent to light. The positions of a pair of side edges 122 of first region 12 correspond to the positions of side faces 54g of the pair of claws 54 when the pair of claws 54 is in the opened position. First region 12 has width W12 corresponding to distance W54 between the pair of claws 54 when the pair of claws 54 is in the opened position. Width W12 of first region 12 in the X-direction corresponds to distance W54 between side faces 54g of the pair of claws 54. The position of front edge 124 of first region 12 correspond to the position of front end faces 54e of the pair of claws 54. The position of rear edge 126 of first region 12 corresponds to the position of rear end faces 54f of the pair of claws 54. Width L12 of first region 12 in the Y-direction corresponds to distance L54 between front end faces 54e and rear end faces 54f of the pair of claws 54.

Second region 14 is formed in a rectangular shape. Second region 14 is indicated in color. For example, second region 14 is indicated in blue. Second region 14 is indicated in the same color as the color of first region 12. The color of second region 14 is lighter than the color of first region 12. For example, first region 12 is indicated in dark blue, and second region 14 is indicated in light blue. Second region 14 may be indicated in a color different from the color of first region 12. Second region 14 is transparent to light. Second region 14 is formed in a range adjacent to first region 12. Front edge 144 of second region 14 contacts rear edge 126 of first region 12. First region 12 is formed at a position corresponding to the pair of claws 54, and second region 14 is formed at a position corresponding to adjacent portion 57 of electronic component clamping device 50.

Third region 16 is formed in a rectangular shape. Third region 16 is indicated in color. For example, third region 16 is indicated in blue. Third region 16 is indicated in the same color as the color of first region 12 and the color of second region 14. The color of third region 16 is lighter than the color of first region 12. The color of third region 16 is lighter than the color of second region 14. For example, first region 12 is indicated in dark blue, second region 14 is indicated in light blue, and third region 16 is indicated in even lighter blue. Third region 16 may be indicated in a color different from the colors of first region 12 and second region 14. Third region 16 is transparent to light. Third region 16 is formed around the periphery of first region 12 and second region 14. Third region 16 surrounds first region 12 and second region 14. Inner edges 162 of third region 16 abut on first region 12 and second region 14. Third region 16 is formed at a position corresponding to peripheral portion 59 of electronic component clamping device 50.

First region 12, second region 14, and third region 16 are indicated in a positional relationship with the pair of claws 54, adjacent portion 57, and peripheral portion 59 when the pair of claws 54 is mounted on electronic component clamping device 50. If the pair of claws 54, adjacent portion 57, and peripheral portion 59 are projected in plan view, the position of the pair of claws 54 correspond to first region 12, the position of adjacent portion 57 corresponds to second region 14, and the position of peripheral portion 59 corresponds to third region 16.

Next, a method of performing interference confirmation using template 10 described above will be described. Prior to performing the interference confirmation, a user of electronic component clamping device 50 first selects distance W54 between the pair of claws 54 from the multiple distances in accordance with the size of electronic component 80 to be clamped. Distance W54 between the pair of claws 54 is adjusted by adjusting the attachment position of the pair of claws 54 to arms 63. For example, it is assumed that distance W54 between the pair of claws 54 is set to 2 cm.

Next, template 10 corresponding to selected distance W54 between the pair of claws 54 is selected. For example, when distance W54 between the pair of claws 54 is set to 2 cm, template 10a for 2 cm is selected.

Figure 7:
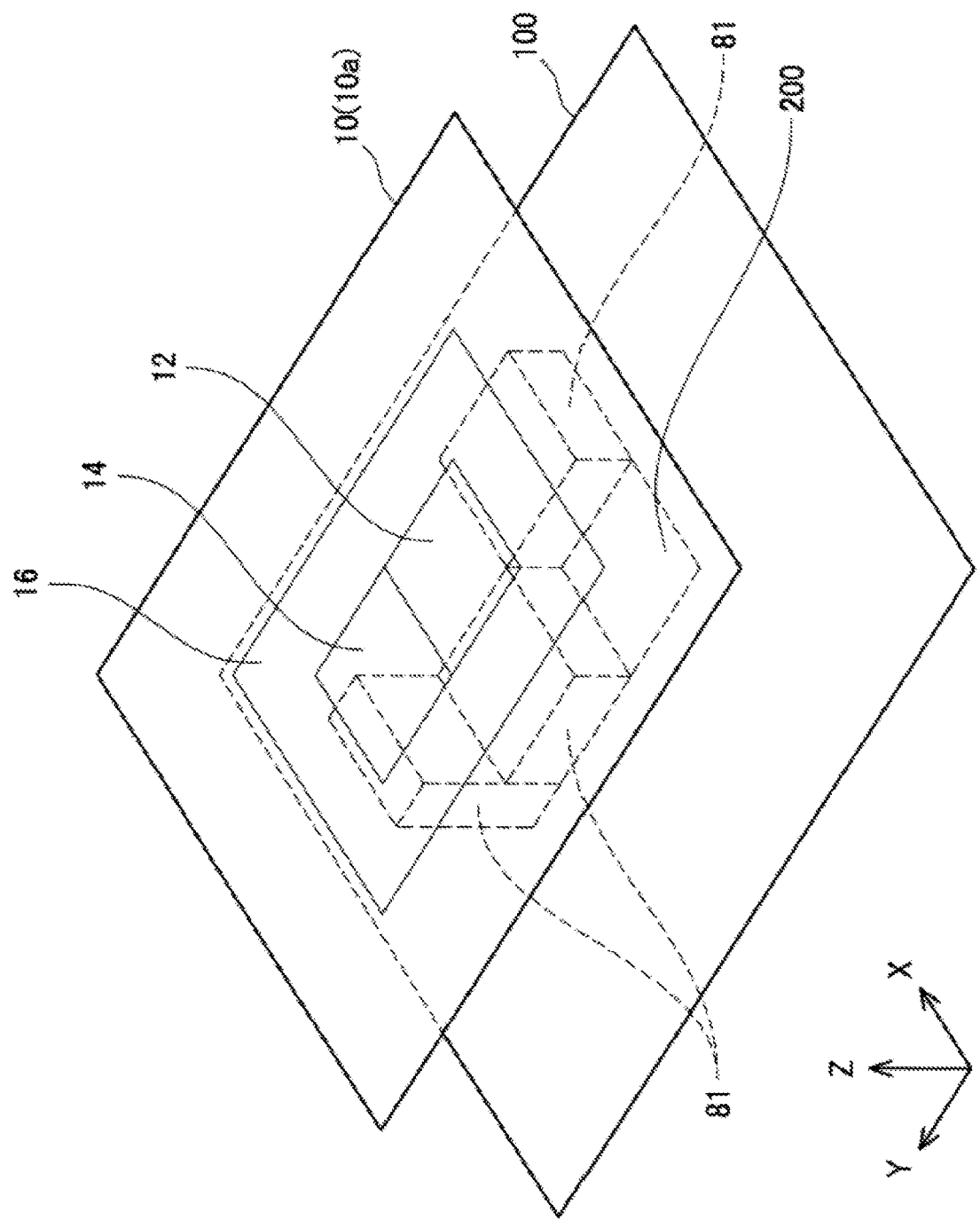
FIG. 7 is a perspective view showing a state in which the template is superimposed on a board.

Next, as shown in FIG. 7, selected template 10 (10a) is superimposed on board 100 on which electronic component 80 is to be mounted. Multiple components 81 other than electronic component 80 have already been mounted on board 100. Multiple components 81 are mounted around mounting position 200 where electronic component 80 is to be mounted. When template 10 (10a) is superimposed on board 100, template 10 is arranged so that first region 12 of template 10 is superimposed on mounting position 200 of electronic component 80.

Next, based on first region 12 of template 10, it is confirmed whether the pair of claws 54 of electronic component clamping device 50 interferes with another component 81 around mounting position 200 of electronic component 80. Specifically, when first region 12 of template 10 superimposed on the mounting position of electronic component 80 interferes with another component 81 around mounting position 200, it is determined that the pair of claws 54 will interfere with another component 81. On the other hand, when first region 12 does not interfere with other component 81, it is determined that the pair of claws 54 will not interfere with another component 81.

Further, based on second region 14 of template 10, it is confirmed whether adjacent portion 57 in the range adjacent to the pair of claws 54 will interfere with another component 81. Specifically, when second region 14 of template 10 superimposed on board 100 interferes with another component 81, it is determined that adjacent portion 57 may interfere with another component 81. If the height of the upper face of another component 81 that interferes with second region 14 is higher than the height of adjacent portion 57, the other component 81 will interfere with adjacent portion 57. Even if second region 14 interferes with another component 81, if the height of the upper face of another component 81 is lower than the height of adjacent portion 57, another component 81 will not interfere with adjacent portion 57. If second region 14 of template 10 does not interfere with another component 81, it is determined that there is no possibility that adjacent portion 57 will interfere with another component 81.

Further, based on third region 16 of template 10, it is confirmed whether peripheral portion 59 surrounding the pair of claws 54 and adjacent portion 57 will interfere with another component 81. Specifically, when third region 16 of template 10 superimposed on board 100 interferes with another component 81, it is determined that peripheral portion 59 may interfere with another component 81. If the height of the upper face of another component 81 that interferes with third region 16 is higher than the height of peripheral portion 59, the other component 81 will interfere with peripheral portion 59. Even if third region 16 interferes with another component 81, when the height of the upper face of another component 81 is lower than the height of peripheral portion 59, another component 81 will not interfere with peripheral portion 59. When third region 16 of template 10 does not interfere with another component 81, it is determined that there is no possibility that peripheral portion 59 will interfere with another component 81.

As described above, by superimposing template 10 (10a) on board 100, it is possible to confirm whether the pair of claws 54 will interfere with another component 81. Further, it is possible to confirm whether adjacent portion 57 and peripheral portion 59 will interfere with another component 81.

When distance W54 between the pair of claws 54 of electronic component clamping device 50 is changed, template 10 corresponding to the changed distance is used to perform interference confirmation similar to the above-described method. For example, when distance W54 between the pair of claws 54 is set to 4 cm or 6 cm, the above-described interference confirmation is performed using template 10b for 4 cm or template 10c for 6 cm, respectively.

Template 10 for electronic component clamping device 50 and the confirmation method using template 10 have been described above. As is apparent from the above description, electronic component clamping device 50 includes the pair of claws 54 that contact the pair of side faces of electronic component 80 to be mounted on board 100 to clamp electronic component 80, and opening/closing mechanism 60 that moves the pair of claws 54 to the closed position (an example of the first position), to clamp electronic component 80, and the opened position (an example of the second position), to release electronic component 80. Template 10 is used to confirm whether the pair of claws 54 interferes with another component 81 around mounting position 200 when electronic component 80 is clamped with the pair of claws 54 and mounted on board 100. In electronic component clamping device 50, distance W54 between the pair of claws 54, when the pair of claws 54 is in the opened position, can be selected from multiple distances in accordance with the size of electronic component 80. There are also multiple templates 10 (10a, 10b, 10c) corresponding to the multiple distances between the pair of claws 54. Template 10 (10a) corresponding to the selected distance (e.g., 2 cm) among the multiple distances between the pair of claws 54 includes first region 12 having width W12 (e.g., 2 cm) corresponding to the selected distance between the pair of claws 54 when the pair of claws 54 is in the opened position.

With such a configuration, when first region 12 of template 10 (10a) superimposed on board 100 interferes with another component 81 already mounted on substrate 100, it can be determined that claws 54 will interfere with another component 81 when the pair of claws 54 is in the opened position. On the other hand, when first region 12 does not interfere with another component 81, it can be determined that the pair of claws 54 will not interfere with another component 81. In this manner, it is possible to easily confirm whether the pair of claws 54 will interfere with another component 81 by simply superimposing template 10 (10a) on board 100.

The above-described electronic component clamping device 50 includes adjacent portion 57 located above the pair of claws 54 in the range adjacent to the pair of claws 54. Template 10 (10a) includes second region 14 located at a position corresponding to adjacent portion 57 in the range adjacent to first region 12.

In a range adjacent to the mounting position of electronic component 80, if another component 81 which is higher than the height of electronic component 80 exists, adjacent portion 57 of electronic component clamping device 50 may interfere with another component 81. However, template 10 includes second region 14. According to such a configuration, when template 10 is superimposed on board 100, if there is another component 81 that interferes with second region 14 of template 10, it can be determined that adjacent portion 57 may interfere with another component 81. On the other hand, if there is no other component 81 that interferes with the second region, it can be determined that there is no possibility that adjacent portion 57 will interfere with another component 81. Whether the pair of claws 54 will interfere with another component 81 can be confirmed using first region 12, and at the same time, whether adjacent portion 57 will interfere with another component 81 can be confirmed using second region 14.

In template 10 described above, first region 12 and second region 14 are indicated in color. The lightness of the color of first region 12 and the lightness of the color of second region 14 are different from each other. According to such a configuration, first region 12 and second region 14 can be clearly distinguished from each other. Therefore, the confirmation with first region 12 and the confirmation with second region 14 can be performed precisely.

Electronic component clamping device 50 described above includes peripheral portion 59 located above adjacent portion 57 in a range surrounding the pair of claws 54 and adjacent portion 57. Template 10 (10a) includes third region 16 located at a position corresponding to peripheral portion 59 around first region 12 and second region 14.

According to such a configuration, similarly to the case of adjacent portion 57 described above, when template 10 is superimposed on board 100, if there is another component 81 that interferes with third region 16 of template 10, it can be determined that peripheral portion 59 may interfere with another component 81. On the other hand, when there is no component 81 that interferes with third region 16, it can be determined that there is no possibility that peripheral portion 59 will interfere with another component 81. By providing second region 14 and third region 16, it is possible to simultaneously perform the interference confirmation of adjacent portion 57 and peripheral portion 59 having different height positions. Therefore, it is possible to perform multistage interference confirmation.

In template 10 described above, third region 16 is indicated in color. The lightness of the color of first region 12, the lightness of the color of second region 14, and the lightness of the color of third region 16 are different from each other. According to such a configuration, first region 12, second region 14, and third region 16 can be clearly distinguished from each other.

The confirmation method described above includes a step of superimposing template 10 (10a) with board 100 on which electronic component 80 is to be mounted, and a step of confirming whether the pair of claws 54 interferes with another component 81 around mounting position 20 based on first region 12 of template 10 (10a). These steps are performed by electronic component clamping device 50. These steps may also be performed by a user. With such a configuration, it is possible to easily confirm whether the pair of claws 54 will interfere with another component 81.

Although one embodiment has been described above, the specific embodiment is not limited to the embodiment described above. For example, in the above embodiment, although adjacent portion 57 is formed on the lower face of main body 61 of opening/closing mechanism 60, the configuration is not limited to this. For example, in another embodiment, it is assumed that a portion of fitting member 52 extends in the Y-direction, and the portion of fitting member 52 extends to a range adjacent to the pair of claws 54. In this case, adjacent portion 57 may be formed by a part of fitting member 52. Although peripheral portion 59 is formed on the lower face of mechanical chuck main body 70 in the above embodiment, the configuration is not limited to this. For example, in another embodiment, the lower face of main body 61 of opening/closing mechanism 60 may be formed in a stepped shape, and adjacent portion 57 and peripheral portion 59 may be formed on the lower face of the stepped shape. Peripheral portion 59 is at a position higher than adjacent portion 57 in the periphery of adjacent portion 57.

While specific examples of the present disclosure have been described in detail above, these are illustrative only and are not intended to limit the scope of the claims. The technology described in the scope of the claims includes various modifications and variations of the specific examples illustrated above. The technical elements described in the present description or the drawings exhibit technical usefulness alone or in various combinations, and are not limited to the combinations described in the claims at the time of filing. In addition, the techniques illustrated in the present description or the drawings can simultaneously achieve multiple objects, and the achievement of one of the objects alone has technical usefulness.

REFERENCE SIGNS LIST

10: template
12: first region
14: second region
16: third region
50: electronic component clamping device
51: attachment section
52: fitting member
54: claw
54a: clamping face
54b: upper end portion
54c: intermediate portion
54d: clamp section
57: adjacent portion
59: peripheral portion
60: opening/closing mechanism
61: main body
63: arm
64: attachment face
70: mechanical chuck main body
80: electronic component
81: component
100: board
200: mounting position

The invention claimed is:

1. A template used in an electronic component clamping device, the electronic clamping device including a pair of claws configured to contact a pair of side faces of an electronic component to be mounted on a board and clamp the electronic component; and a moving mechanism configured to move the pair of claws to a first position for clamping the electronic component and a second position for releasing the electronic component; the template comprising:

multiple plate-like templates provided to correspond to the multiple distances between the pair of claws and used in confirming whether the pair of claws will interfere with another component around a mounting position when the pair of claws clamps the electronic component and mounts the electronic component on the board, wherein, in the electronic component clamping device, a distance between the pair of claws when the pair of claws is in the second position can be selected from multiple distances in accordance with the size of the electronic component; and a first region which has a width corresponding to the selected distance between the pair of claws when the pair of claws is in the second position, the first region being provided on each of the multiple plate-like templates corresponding to the selected distances between the pair of claws from among the multiple distances.

2. The template for an electronic component clamping device according to claim 1, wherein the electronic component clamping device further comprises an adjacent portion located above the pair of claws in a range adjacent to the pair of claws, and the template corresponding to the selected distance further comprises a second region which is located at a position corresponding to the adjacent portion in a range adjacent to the first region.

3. The template for an electronic component clamping device according to claim 2, wherein the first region and the second region are indicated in color, and a lightness of color of the first region and a lightness of color of the second region are different.

4. The template for an electronic component clamping device according to claim 2, wherein the electronic component clamping device further comprises a peripheral portion located above the adjacent portion in a range surrounding the pair of claws and the adjacent portion, and the template corresponding to the selected distance further comprises a third region which is located at a position corresponding to the peripheral portion around the first region and the second region.

5. The template for an electronic component clamping device according to claim 4, wherein the third region is indicated in color, and the lightness of the color of the first region, the lightness of the color of the second region, and a lightness of color of the third region are different from each other.

6. A confirmation method for confirming whether a pair of claws interferes with another component around a mounting position when the pair of claws clamps and mounts an electronic component on a board using a plate-like template in an electronic component clamping device including the pair of claws configured to contact a pair of side faces of the electronic component to be mounted on the board and clamp the electronic component, and a moving mechanism configured to move the pair of claws to a first position for clamping the electronic component and a second position for releasing the electronic component;

wherein multiple plate-like templates are provided to correspond to the multiple distances between the pair of claws and are used in confirming whether the pair of claws will interfere with another component around a mounting position when the pair of claws clamps the electronic component and mounts the electronic component on the board, wherein, in the electronic component clamping device, a distance between the pair of claws when the pair of claws is in the second position can be selected from multiple distances in accordance with the size of the electronic component, the multiple plate-like templates having a first region which has a width corresponding to the selected distance between the pair of claws when the pair of claws is in the second position, the first region being provided on each of the multiple plate-like templates corresponding to the selected distances between the pair of claws from among the multiple distances the confirmation method comprising:

a step of superimposing the template corresponding to the selected distance with the board on which the electronic component is mounted, a step of confirming whether the pair of claws interfere with another component around the mounting position based on the first region of the template.

* * * * *